(12) United States Patent
Fleischman et al.

(10) Patent No.: US 12,206,061 B2
(45) Date of Patent: Jan. 21, 2025

(54) ELECTRONIC DEVICE HAVING DISPLAY WITH INTERNAL LIGHT REFLECTION SUPPRESSION

(71) Applicant: Apple Inc., Cupertino, CA (US)

(72) Inventors: Dagny Fleischman, Campbell, CA (US); Chi-Jui Chung, Santa Clara, CA (US); Enkhamgalan Dorjgotov, Mountain View, CA (US); Giovanni Carbone, Palo Alto, CA (US); Graham B. Myhre, San Jose, CA (US); Michael Slootsky, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/915,629

(22) Filed: Jun. 29, 2020

(65) Prior Publication Data

US 2021/0036265 A1     Feb. 4, 2021

Related U.S. Application Data

(60) Provisional application No. 62/880,220, filed on Jul. 30, 2019.

(51) Int. Cl.
*H01L 51/52*     (2006.01)
*G02B 1/08*      (2006.01)
(Continued)

(52) U.S. Cl.
CPC ......... *H10K 50/865* (2023.02); *H10K 50/844* (2023.02); *H10K 59/12* (2023.02);
(Continued)

(58) Field of Classification Search
CPC ............. H01L 51/5284; H01L 51/5253; H01L 51/5275; H01L 51/5293; H01L 2251/301;
(Continued)

(56) References Cited

U.S. PATENT DOCUMENTS 5,715,029 A * 2/1998 Fergason ............. H04N 5/7491
349/196
5,982,464 A * 11/1999 Wang ................. G02F 1/133753
349/75

(Continued)

FOREIGN PATENT DOCUMENTS

JP      2009139749 A       6/2009
WO   WO-2008137843 A1 * 11/2008   ......... G02F 1/13338

*Primary Examiner* — Ida M Soward
(74) *Attorney, Agent, or Firm* — Treyz Law Group, P.C.; G. Victor Treyz; Jinie M. Guihan

(57) ABSTRACT

An electronic device may have a display. The display has pixels configured to display an image. The display is mounted in a housing. The housing may include head-mounted support structures configured to support the display for viewing through lenses. The pixels of the display may be covered by a layer of thin-film encapsulation. The thin-film encapsulation may be covered with a cover layer such as a glass cover layer that is attached to the thin-film encapsulation layer by a layer of adhesive. To suppress internal light reflections, the display may include reflection suppression structures. The reflection suppression structures may include an antireflection layer and/or polarizer and waveplate layers. The reflection suppression structures may be formed on an outwardly facing surface of the cover layer and/or between the thin-film encapsulation layer and the cover layer.

20 Claims, 6 Drawing Sheets

(51) Int. Cl.
| | |
|---|---|
| G02B 5/30 | (2006.01) |
| G02B 27/00 | (2006.01) |
| G02B 27/01 | (2006.01) |
| G02F 1/133 | (2006.01) |
| H01L 27/32 | (2006.01) |
| H10K 50/844 | (2023.01) |
| H10K 50/86 | (2023.01) |
| H10K 59/12 | (2023.01) |
| G02F 1/1333 | (2006.01) |
| G02F 1/1335 | (2006.01) |
| H10K 50/80 | (2023.01) |
| H10K 102/00 | (2023.01) |

(52) U.S. Cl.
CPC .. *G02F 1/133331* (2021.01); *G02F 1/133528* (2013.01); *H10K 50/868* (2023.02); *H10K 2102/00* (2023.02)

(58) Field of Classification Search
CPC ........... H01L 27/3244; G02F 1/133528; G02F 1/133331; G02B 1/08; G02B 5/3033; G02B 5/3083; G02B 27/0172; G02B 27/0018
See application file for complete search history.

(56) References Cited

U.S. PATENT DOCUMENTS

| | | | | |
|---|---|---|---|---|
| 6,130,735 | A * | 10/2000 | Hatanaka | G02F 1/133504 349/114 |
| 6,272,097 | B1 * | 8/2001 | Nakao | G11B 7/1372 |
| 6,456,347 | B1 * | 9/2002 | Motomura | G02F 1/133555 349/113 |
| 6,661,483 | B1 * | 12/2003 | Moriwaki | G02F 1/1397 349/113 |
| 7,110,071 | B2 * | 9/2006 | Matsushima | G02F 1/13363 349/98 |
| 7,432,649 | B2 | 10/2008 | West | |
| 7,821,696 | B2 | 10/2010 | Tonar et al. | |
| 8,101,249 | B2 * | 1/2012 | Akao | G02F 1/13363 349/193 |
| 8,249,408 | B2 | 8/2012 | Coleman | |
| 9,818,976 | B2 * | 11/2017 | Poon | H10K 71/00 |
| 9,904,502 | B2 | 2/2018 | Yan et al. | |
| 10,180,572 | B2 | 1/2019 | Osterhout et al. | |
| 10,267,970 | B2 | 4/2019 | Jones, Jr. et al. | |
| 10,297,647 | B2 * | 5/2019 | Wang | H10K 50/86 |
| 10,367,173 | B1 * | 7/2019 | Wu | H04M 1/0268 |
| 2001/0055089 | A1 * | 12/2001 | Van De Witte | C09K 19/586 349/185 |
| 2004/0008302 | A1 * | 1/2004 | Moon | G02F 1/13362 349/115 |
| 2005/0030447 | A1 * | 2/2005 | Hsu | G02F 1/13363 349/102 |
| 2005/0151152 | A1 * | 7/2005 | Miller | G02B 30/25 348/E13.044 |
| 2006/0023143 | A1 * | 2/2006 | Lee | G02B 30/25 348/E13.044 |
| 2006/0139539 | A1 * | 6/2006 | Chen | G02F 1/1393 349/129 |
| 2007/0211198 | A1 * | 9/2007 | Nagai | G02F 1/133555 349/114 |
| 2008/0258614 | A1 * | 10/2008 | Ha | G02B 5/3058 359/485.05 |
| 2009/0027612 | A1 * | 1/2009 | Tomita | G02B 5/3016 349/182 |
| 2009/0290102 | A1 * | 11/2009 | Amimori | G03F 7/095 428/411.1 |
| 2010/0110551 | A1 | 5/2010 | Lamansky et al. | |
| 2011/0261299 | A1 * | 10/2011 | Tai | G02B 30/25 349/98 |
| 2012/0140150 | A1 * | 6/2012 | Matsushima | G02F 1/133502 349/96 |
| 2012/0236234 | A1 * | 9/2012 | Ishiguro | G02B 5/22 349/96 |
| 2012/0327336 | A1 * | 12/2012 | Jeon, II | G02B 5/3016 349/96 |
| 2013/0032830 | A1 * | 2/2013 | Lee | G02B 5/3041 257/40 |
| 2013/0088669 | A1 * | 4/2013 | Lee | G02F 1/1347 445/24 |
| 2013/0128193 | A1 * | 5/2013 | Yang | G02F 1/133514 349/110 |
| 2013/0229603 | A1 * | 9/2013 | Tamaki | G02F 1/133504 349/113 |
| 2013/0342793 | A1 * | 12/2013 | Takeda | G02F 1/1335 349/96 |
| 2014/0055373 | A1 * | 2/2014 | Powell | G02F 1/13363 345/173 |
| 2014/0098420 | A1 * | 4/2014 | Chung | G02B 5/3083 445/24 |
| 2014/0192277 | A1 * | 7/2014 | Yilmaz | G02B 1/10 349/12 |
| 2014/0198272 | A1 * | 7/2014 | Hamaguchi | G02B 5/3083 349/96 |
| 2014/0265822 | A1 * | 9/2014 | Drzaic | H10K 50/865 313/504 |
| 2015/0129852 | A1 * | 5/2015 | Park | H10K 59/1213 257/40 |
| 2016/0079337 | A1 * | 3/2016 | Mathew | H10K 50/865 257/40 |
| 2016/0197309 | A1 * | 7/2016 | Drolet | H10K 50/86 257/40 |
| 2016/0291228 | A1 * | 10/2016 | Lee | G02B 5/3016 |
| 2016/0313616 | A1 * | 10/2016 | Arai | G02F 1/134309 |
| 2017/0125743 | A1 * | 5/2017 | Kim | G02B 5/3016 |
| 2017/0190942 | A1 | 7/2017 | Kim et al. | |
| 2017/0199428 | A1 * | 7/2017 | Lin | G02F 1/134336 |
| 2017/0207279 | A1 * | 7/2017 | Zeng | G06F 3/0445 |
| 2017/0343713 | A1 * | 11/2017 | Lee | G02B 5/3016 |
| 2017/0372113 | A1 * | 12/2017 | Zhang | H10K 50/854 |
| 2018/0006274 | A1 * | 1/2018 | Kim | G02B 27/286 |
| 2018/0047945 | A1 * | 2/2018 | Hack | H10K 59/873 |
| 2018/0059300 | A1 * | 3/2018 | Kim | G02B 1/14 |
| 2018/0067574 | A1 * | 3/2018 | Masumoto | G06F 3/0412 |
| 2018/0180938 | A1 * | 6/2018 | Hai | G02B 5/3033 |
| 2018/0212200 | A1 * | 7/2018 | Wang | G02B 5/3083 |
| 2018/0307077 | A1 * | 10/2018 | Miura | E06B 3/6722 |
| 2018/0357460 | A1 * | 12/2018 | Smith | H10K 59/40 |
| 2019/0041642 | A1 | 2/2019 | Haddick et al. | |
| 2019/0044093 | A1 * | 2/2019 | Sargent | G06F 1/1601 |
| 2019/0079236 | A1 * | 3/2019 | Hung | H10K 59/00 |
| 2019/0086675 | A1 * | 3/2019 | Carollo | G02B 27/288 |
| 2019/0156741 | A1 | 5/2019 | Kim et al. | |
| 2019/0170928 | A1 | 6/2019 | Nichol et al. | |
| 2019/0204634 | A1 * | 7/2019 | Liang | G02F 1/1336 |
| 2020/0013838 | A1 * | 1/2020 | Takechi | H10K 59/123 |
| 2020/0050823 | A1 * | 2/2020 | Jiang | G02B 5/3083 |
| 2020/0365831 | A1 * | 11/2020 | Polyakov | G02B 27/286 |
| 2021/0357609 | A1 * | 11/2021 | Chen | G06V 40/1318 |

* cited by examiner

ELECTRONIC DEVICE HAVING DISPLAY WITH INTERNAL LIGHT REFLECTION SUPPRESSION

This application claims the benefit of provisional patent application No. 62/880,220, filed Jul. 30, 2019, which is hereby incorporated by reference herein in its entirety.

FIELD

This relates generally to electronic devices, and, more particularly, to electronic devices with displays.

BACKGROUND

Displays such as organic light-emitting diode displays may be used in electronic devices such as head-mounted devices. During operation, the pixels in a display emit light. The light passes through overlapping transparent structures for viewing by a user.

It can be challenging to form emissive displays for electronic devices such as head-mounted devices. The transparent structures that overlap an emissive display may help protect the display, but serve as a potential high-refractive-index layer that can trap and guide off-axis emitted light rays in accordance with the principal of total internal reflection. Particularly in a display with a high pixel density such as a display in a head-mounted device, there are numerous surface imperfections that can scatter this trapped light outwardly, thereby reducing the contrast of the display.

SUMMARY

An electronic device may have a display. The display has pixels configured to display an image. The display is mounted in a housing. The housing may include head-mounted support structures configured to support the display for viewing through lenses.

The pixels of the display may be thin-film organic light-emitting diode pixels or other pixels covered by a layer of thin-film encapsulation. The thin-film encapsulation may be covered with a cover layer such as a glass cover layer that is attached to the thin-film encapsulation layer by a layer of adhesive.

To suppress internal light reflections within the transparent layer of the display such as the thin-film encapsulation layer and cover layer, the display may include reflection suppression structures. The reflection suppression structures may include an antireflection layer and/or polarizer and waveplate layers. Antireflection layers may be formed form moth-eye structures, thin-film interference filters, microlenses, and/or other antireflection structures. In configurations in which the reflection suppression structures include polarizer and waveplate structures, the reflection suppression structures may include a quarter waveplate and a linear polarizer between the quarter wave plate and the display cover layer. A coating containing an anti-scratch layer and/or other layers may be formed on an outwardly facing surface of the quarter wave plate.

DETAILED DESCRIPTION

An electronic device may have a display. The display may present images for a user during operation of the device. In some configurations, the display may be an emissive display having pixels formed from light-emitting devices such as light-emitting diodes. The display may include reflection suppression structures to help enhance display contrast.

Figure 1:
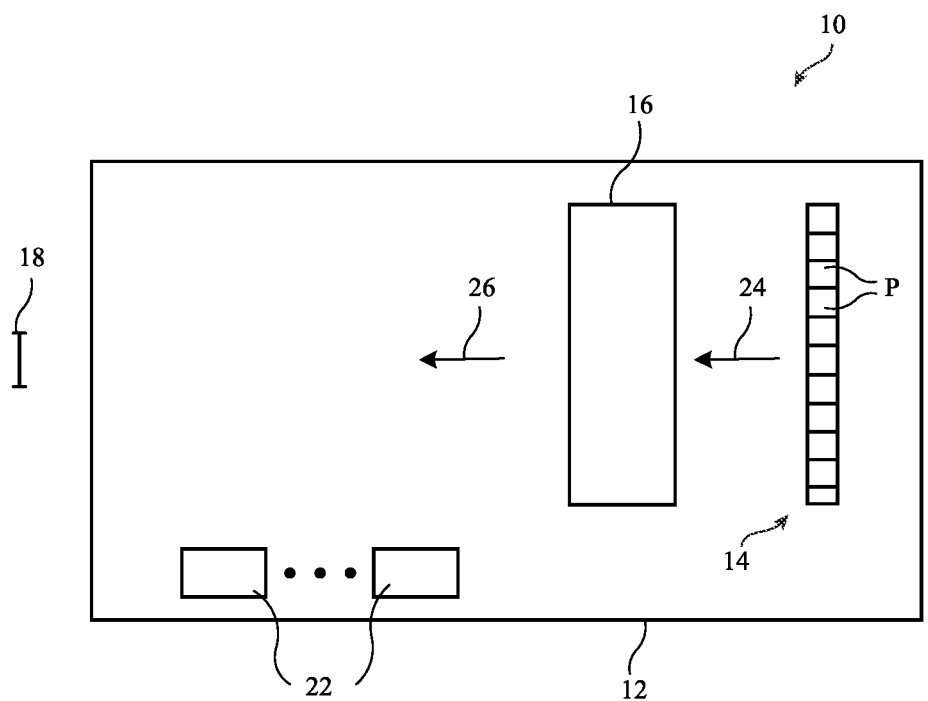
FIG. 1 is a side view of an illustrative electronic device in accordance with an embodiment.

A diagram of an illustrative electronic device with a display is shown in FIG. 1. Device 10 may be a head-mounted device such as a pair of glasses, goggles, a helmet, a head-mounted device based on a hat or headband structure, or other equipment that is worn on a user's head. Other types of electronic equipment may be used in forming electronic devices such as device 10 if desired. For example, device 10 may be a wristwatch device or other device that is worn on a portion of a user's body other than the user's head, may be a stand-alone device that rests on a desktop or that is built into a kiosk or vehicle, may be a cellular telephone, tablet computer, laptop computer, or other portable electronic device, or may be other suitable electronic equipment. Illustrative configurations in which device 10 is a head-mounted device may sometimes be described herein as an example.

Electronic device 10 may have a display such as display 14. Display 14 may be any suitable type of display. As an example, display 14 may be an emissive display having an array of pixels P that emit light such as organic light-emitting diode pixels or light-emitting diode pixels formed from crystalline semiconductor dies. Pixels P in display 14 may be formed on a rigid or flexible substrate and may have a planar shape or a curved shape with a curved cross-sectional profile.

Electronic device 10 may have a housing such as housing 12. Housing 12, which may sometimes be referred to as an enclosure or support structure, may be configured to be worn on a user's head (e.g., device 10 may be a head-mounted device and housing 12 may serve as a head-mounted support structure). In this type of illustrative arrangement, images from display 14 may pass through lens 16 for viewing by a user's eye located in eye box 18. There may be multiple lenses 16 and multiple sets of display pixels P for displaying images for the user's eyes (e.g., a pair of lenses 16 and a pair of pixel groups for left and right eye boxes associated with the user's left and right eyes). FIG. 1 shows a single eye box 18 to avoid over-complicating the drawing.

During operation, pixels P in device 14 (e.g., a layer of pixels in an array or other pattern) may be used to display images. Image light 24 is emitted by display 14 and is received by lens 16. Light 24 passes through lens 16 and is provided to eye box 18 as image light 26 so that a user may view the displayed images. In some configurations, light 24 may be polarized (e.g., circularly polarized) and lens 16 may be a reflective lens such as a catadioptric lens that receives and uses polarized light (e.g., circularly polarized light).

Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose an interior region within device 10 and may separate the interior region from an exterior region surrounding device 10. Housing structures for device 10 may, if desired, include head straps and other support structures that allow device 10 to be worn by a user.

Electrical components 22 may be mounted in the interior of device 10 (e.g., within an interior region of housing 12. Components 22 may include integrated circuits, discrete components, light-emitting components, sensors, and/or other circuits. Electrical components 22 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output, to transmit signals to external equipment, to adjust display 14, and/or to perform other tasks. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 22.

Input-output circuitry in components 22 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays such as display 14, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 22) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 22 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 22 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Figure 2:
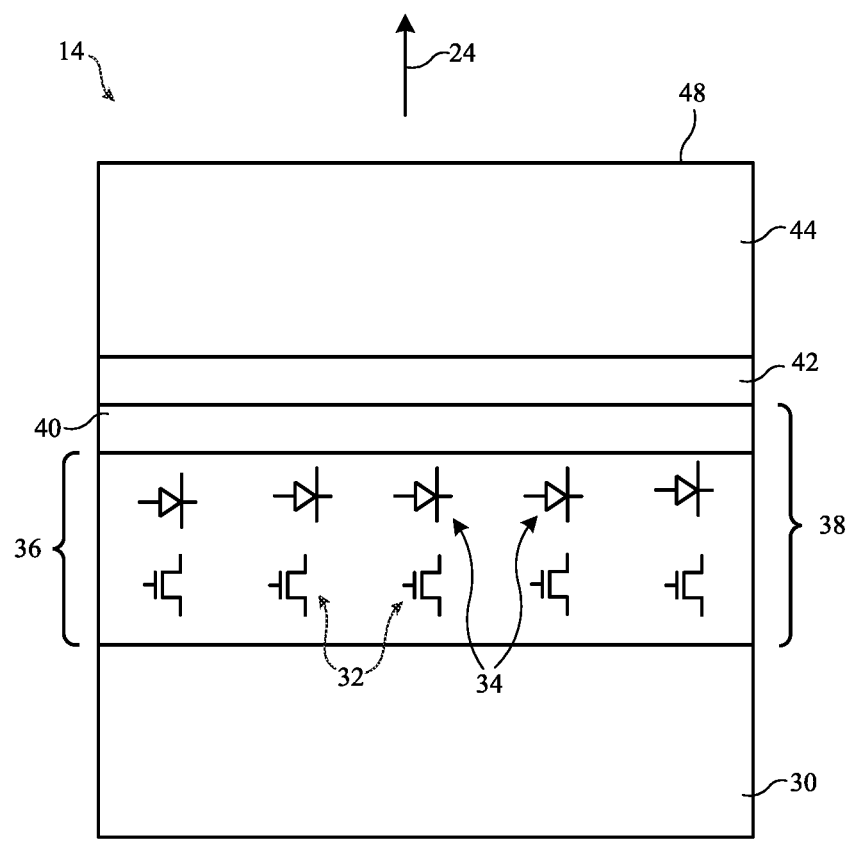
FIG. 2 is a side view of an illustrative display in accordance with an embodiment.

A cross-sectional side view of an illustrative display for device 10 is shown in FIG. 2. As shown in FIG. 2, display 14 may have a substrate such as substrate 30. Substrate 30 may be, for example, a flexible polymer substrate such as a layer of polyimide or may be a rigid substrate. Substrate 30 may be planar or may have a curved cross-sectional profile. Pixels P may be formed form respective light-emitting diodes 34 and pixel circuits formed from transistors 32. In an organic light-emitting diode display, diodes 34 are thin-film organic light-emitting diodes and transistors 32 are thin-film transistors formed in a layer of thin-film circuitry on substrate 30 such as thin-film circuitry layer 36. Thin-film circuitry layer 36 may have structures that create a non-smooth surface such as anodes, cathodes, pixel definition layers, routing, and other thin-film structures.

To protect thin-film circuitry in layer 36, display 14 may include a layer of thin-film encapsulation such as thin-film encapsulation layer 40. Thin-film encapsulation layer 40 may be formed from thin-film layers such as silicon nitride layers and/or other inorganic layers interspersed with optional polymer layers. Thin-film encapsulation layer 40 may help prevent moisture from damaging underlying structures in thin-film circuitry layer 36. The thickness of layer 40 may be less than 10 microns, less than 3 microns, less than 2 microns, at least 0.05 microns, at least 0.3 microns, or other suitable thickness.

Thin-film layer 38 (e.g., thin-film circuitry layer 36 and thin-film encapsulation layer 40) may be provided with additional protection. For example, additional protection may be provided by attaching cover layer 44 to display 14 (e.g., to the outer surface of thin-film encapsulation layer 40) using adhesive such as optically clear adhesive layer 42. Cover layer 44 may be formed from glass or other transparent material to help protect thin-film circuitry layer 36 from moisture and/or scratches. The thickness of layer 44 may be, as an example, 0.1 microns to 100 microns, at least 10 microns, at least 100 microns, at least 400 microns, less than 1000 microns, less than 500 microns, or other suitable thickness.

Figure 3:
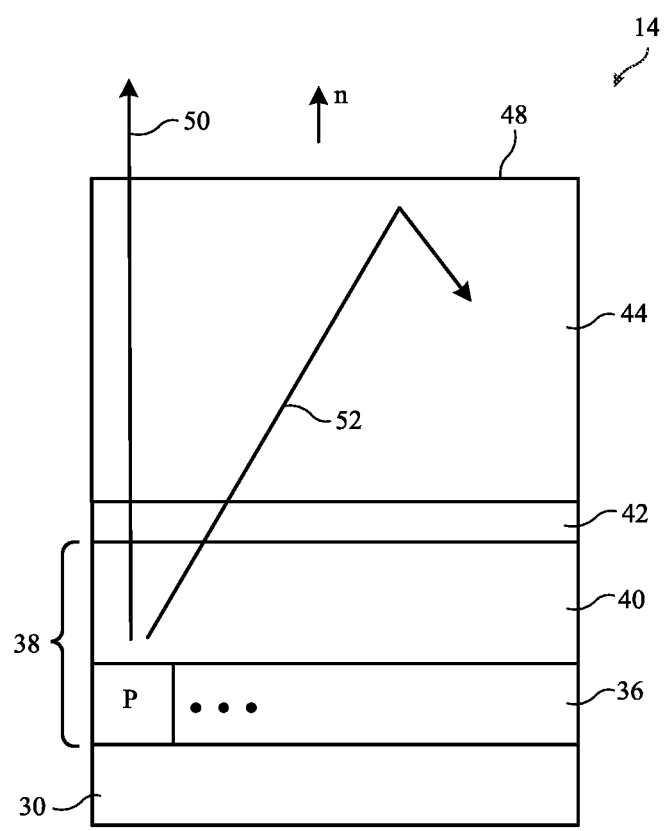
FIG. 3 is a cross-sectional side view of an illustrative display without reflection suppression structures showing how off-axis emitted light may be trapped and spread outwardly before being scattered out of the display.

As shown in FIG. 3, some light emitted from a pixel P in layer 36 such as illustrative light ray 50 may be emitted parallel or nearly parallel to surface normal n of display 14. This light passes through surface 48 of display 14 and is received by lens 16. Off-axis light such as light ray 52 strikes surface 48 of display 14 at an angle that is sufficiently large to support total internal reflection. Accordingly, there is a risk that off-axis light rays such as ray 52 will be reflected internally at surface 48 and guided laterally (e.g., in the X-Y plane) away from pixel P within the transparent material (layer) of display 14 such as layer 44, layer 42, and layer 40 in accordance with the principal of total internal reflection. Eventually, these guided rays could be scattered out of the transparent layer of display 14 due to surface irregularities on the surface of layer 36. Because the scattered light would no longer be located at the source of light ray 52 (e.g., pixels P in this scenario), this scattered light is a potential cause of reduced display contrast. To prevent such loss of display contrast, display 14 may be provided with reflection suppression structures.

In general, display 14 may have any suitable pixel density (e.g., 400-800 pixels per inch, at least 350 pixels per inch, at least 2000 pixels per inch, less than 4000 pixels per inch, less than 2000 pixels per inch, etc.). In displays with pixel arrays configured in operating in head-mounted displays, pixels P may, in some embodiments, have a density of at least 1000 pixels per inch or at least 1500 pixels per inch, which may increase the risk for light scattering and contrast reduction due to internal reflections.

Figure 4:
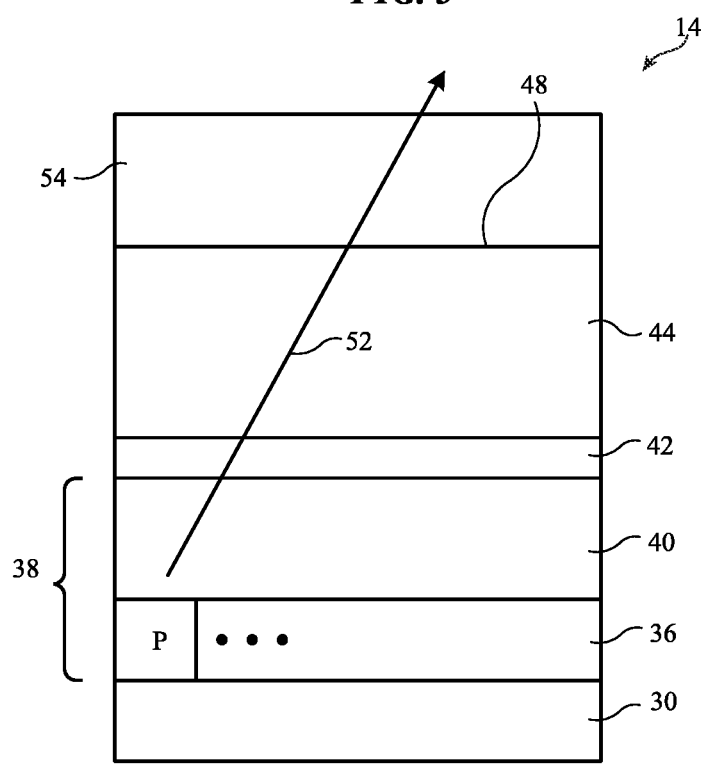
FIG. 4 is a cross-sectional side view of an illustrative display with an antireflection layer in accordance with an embodiment.

To help suppress light scattering, internal reflections of rays such as ray 52 from surface 48 may be minimized using reflection suppression structures. With one illustrative configuration, which is shown in FIG. 4, display 14 may have an antireflection layer such as antireflection layer 54 on surface 48. As shown in FIG. 4, in the presence of antireflection layer 54, off-axis light rays such as light ray 52 may pass out of display 14 and are not trapped within the transparent layers of display 14.

Figure 5:
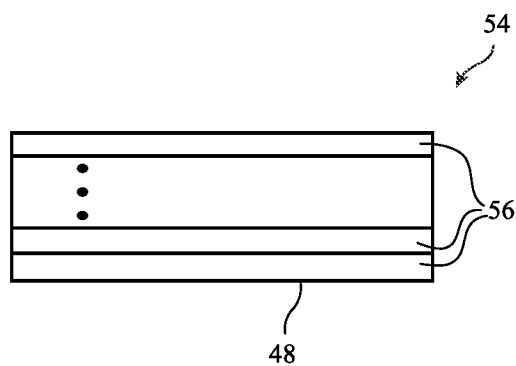
FIG. 5 is a cross-sectional side view of an illustrative antireflection layer formed from a thin-film interference filter structure having a stack of dielectric layers of different refractive index values in accordance with an embodiment.

Antireflection layer 54 may be formed from a stack of dielectric layers with different refractive index values (e.g., alternating high and low refractive index values). This type of arrangement is shown in FIG. 5. As shown in FIG. 5, antireflection layer 54 may be formed from a thin-film interference filter formed from a stack of dielectric thin-film layers 56. The thin-film interference filter may be tuned to enhance light transmission out of display 14 at the wavelengths of light emitted by pixels P (e.g., red, green, and blue visible light wavelengths).

Figure 6:
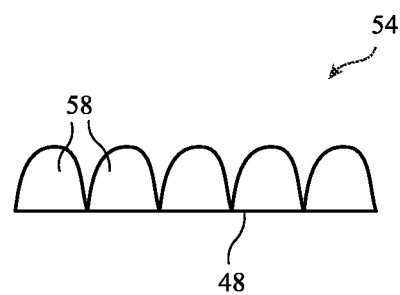
FIG. 6 is a cross-sectional side view of an illustrative antireflection layer formed from microstructures such as microlenses in accordance with an embodiment.

In the example of FIG. 6, antireflection layer 54 has been formed from an array of microstructures such as microlenses 58. Microlenses 58 may have lateral dimension on the order of a pixel size (e.g., 10 microns or less, 20 microns or less, at least 3 microns, or other suitable size).

Figure 7:
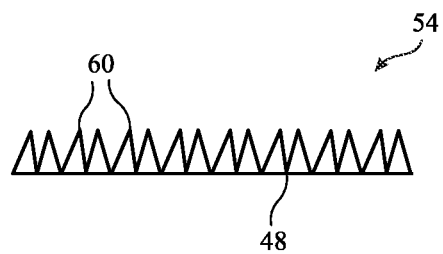
FIG. 7 is a cross-sectional side view of an illustrative antireflection layer formed from microstructures such as moth-eye structures in accordance with an embodiment.

Another illustrative configuration for antireflection layer 54 is shown in FIG. 7. In the example of FIG. 7, antireflection layer 54 has been formed from a moth-eye structure in which multiple protrusions 60 with small lateral dimensions (e.g. sub-wavelengths sizes, less than 1 micron, less than 0.5 microns, less than 0.3 microns, or other suitable sizes). Microstructures such as the moth-eye structures of FIG. 7 and the microlens structures of FIG. 6 may be formed by etching, sandblasting, nano-imprinting, attachment of laminated textured films, photolithography followed by reflow operations, self-assembled growth techniques (e.g., crystal growth techniques), and/or other suitable fabrication techniques.

Figure 8:
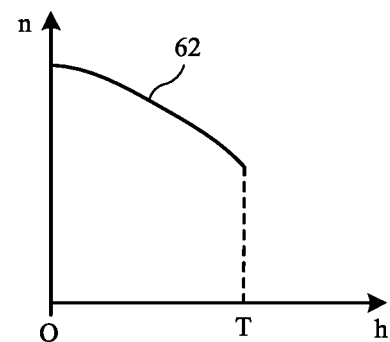
FIG. 8 is a graph showing how an antireflection layer may be formed from a graded-index layer in accordance with an embodiment.

In another illustrative configuration, antireflection layer 54 may be formed from a graded index material. The graded index material may have an index of refraction n that varies smoothly and continuously from a first (higher) value at outwardly facing surface 48 of layer 44 to a second (lower) value at the outwardly facing surface of the graded index material. An illustrative index profile for the graded index material is illustrated by curve 62 of the graph of FIG. 8. The distance from surface 48 through the graded index material is given by h. At h=0, the graded index material forms an interface with surface 48 on the top of display 14. At h=H, the graded index material is exposed to air. At intermediate values of h, the value of the refractive index n of the graded index material gradually changes.

If desired, antireflection coatings may also be formed using a single layer of material (e.g., a thin-film layer of material with a refractive index that lies between the refractive index of layer 44 and the refractive index of air).

In addition to or instead of using antireflection structures to reduce internal reflections of off-axis light rays such as ray 52, display 14 may include polarizer structures to help reduce reflections. Polarizer-based reflection reduction structures may, for example, be formed from circular polarizers or other polarizer structures having a linear polarizer and a wave plate.

Figure 9:
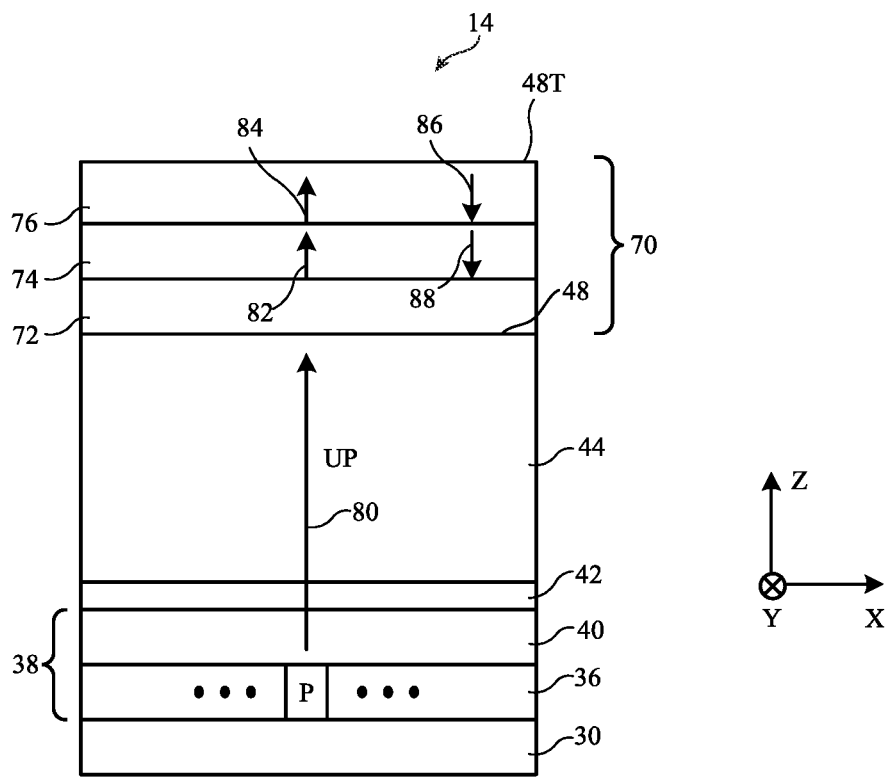
FIG. 9 is a cross-sectional side view of an illustrative display with reflection suppression structures formed from a linear polarizer and quarter wave plate in accordance with an embodiment.

Consider, as an example, the arrangement of FIG. 9. As shown in FIG. 9, pixels such as pixel P may emit light rays such as light ray 80 (on-axis rays and off-axis rays) and these light rays may propagate outwardly toward surface 48 of layer 44.

Reflection suppression layer 70 may be formed on the transparent layers of display 14 (e.g., on the transparent layer of display 14 formed form thin-film encapsulation layer 40, adhesive layer 42, and cover layer 44). Layer 70 may include polarizer and retarder structures. Optional layer 76 on quarter wave plate 74 of layer 70 may include a thin-film hard coat layer (e.g., a dielectric anti-scratch film formed form a transparent dielectric layer such as silicon nitride, an anti-scratch formed from other inorganic materials such as metal nitride, silicon oxide, metal oxide, diamond-like coating material, other transparent material with abrasion resistance, and/or other hard coat materials), an adhesive layer, and/or other layer(s). The refractive index of layer 70 may be matched or close to the refractive index of layers 46, 44, and 42, so that internal reflections at surface 48 of layer 46 may be minimized. Upper surface 48T is exposed to air and may therefore give rise to a potential for internal reflections of on-axis and off-axis light.

To help suppress internal reflections from surface 48T and thereby prevent contrast loss due to scattered light, layer 70 may include a circular polarizer. In particular, layer 70 may include linear polarizer 72 on surface 48 and a retarder such as quarter wave plate 74 on linear polarizer 72. Linear polarizer 72 and quarter wave plate 74 may be formed on surface 48 and may be covered by optional layer(s) 76. Additional optical layers may also be included in layer 70. For example, one or more birefringent layers may be provided between linear polarizer 72 and to help enhance off-axis viewing performance, a hard coat layer may be included between linear polarizer 72 and layer 44, etc.

When pixel P emits light 80, light 80 is initially unpolarized. Layers 40, 42, and 44 are transparent, so unpolarized light 80 travels outwardly from pixel P to linear polarizer 72. Linear polarizer 72, which may sometimes be referred to as a linear polarizer layer, linearly polarizes light 80 to form linearly polarized light 82. Light 82 passes through quarter wave plate 74 and becomes circularly polarized light 84. To help suppress reflections from the outermost surface of display 14, optional quarter wave plate 74 may include an antireflection coating (e.g., an antireflection layer may be provided on an anti-scratch layer on quarter wave plate 74). Nevertheless, due to the refractive index mismatch between the layers of display 14 and surrounding air, some of circularly polarized light 84 may reflect internally from the outermost surface of the layers on display 14. In the example of FIG. 9, circularly polarized light 84 reflects internally from surface 48T of optional layer 76 as downwardly directed circularly polarized light 86. As light 86 travels downward through quarter wave plate 74, light 86 retraces the path taken by outwardly directed circularly polarized light 82 and becomes linearly polarized with a polarization axis that is perpendicular to the polarization axis of linearly polarized light 82.

Consider, an example, a scenario in which linear polarizer 72 has a pass axis aligned with the X axis of FIG. 9. In this scenario, linearly polarized light 82 at the upper surface of linear polarizer 72 and the lower surface of quarter wave plate 74 will have a polarization axis aligned with the X axis. In this configuration, the downward passage of circularly polarized light 86 through quarter wave plate 74 will produce linearly polarized light 88 at the lower surface of quarter wave plate 74 having a polarization axis that is rotated by 90° about the Z axis with respect to light 82. As a result, light 88 has a polarization axis that is aligned with the Y axis of FIG. 9 and that is orthogonal to the polarization axis of linear polarizer 72. With this rotated polarization state, linearly polarized light 88 is absorbed by linear polarizer 72 and is thereby blocked from returning to layer 44. The presence of the circular polarizer formed from linear polarizer 72 and quarter wave plate 74 thereby suppresses internal reflection of light 80 and helps enhance the contrast of display 14.

Figure 10:
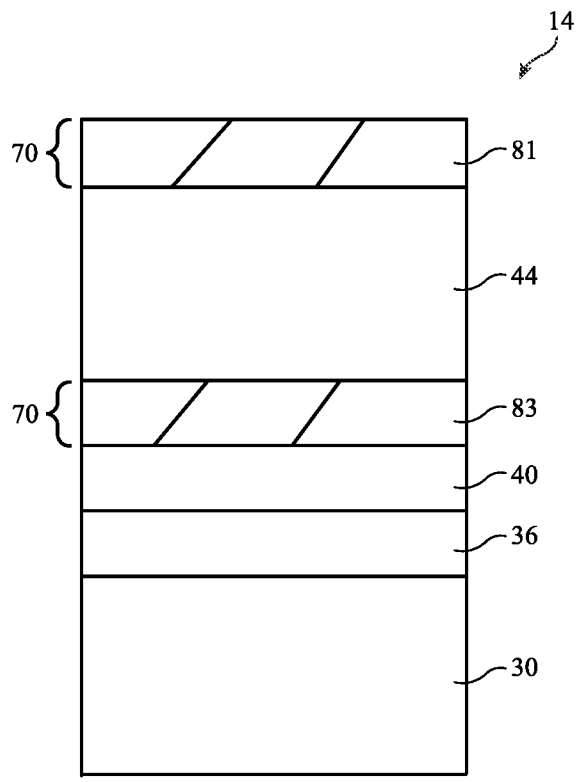
FIG. 10 is a cross-sectional side view of an illustrative display with one or more layers of reflection suppression structures in accordance with an embodiment.
Figure 9:
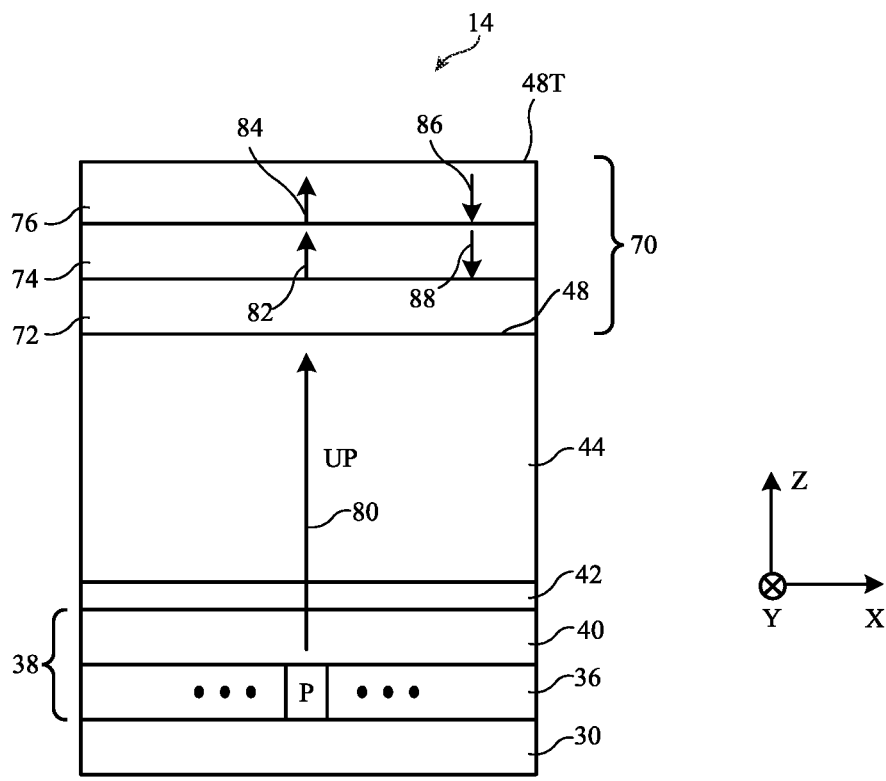
Figure 10:
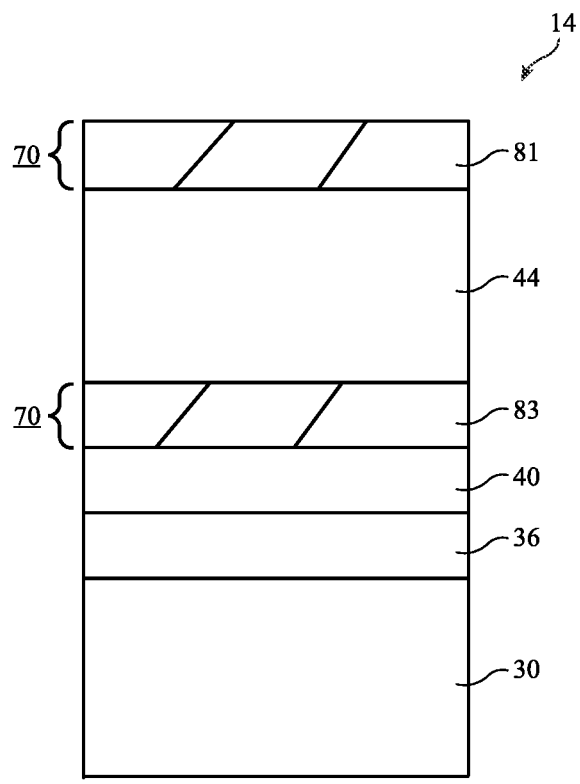

If desired, one or more layers such as layer 70 and/or one or more layers such as antireflection layer 54 may be used in display 14. For example, an antireflection layer may be formed on the outermost surface of quarter wave plate 74 (e.g., directly on quarter wave plate 74 or on one or more coating layers on quarter wave plate 74 such as an anti-scratch coating). As another example, a polarizer-based reflection absorption layer such as reflection suppression layer 70 and/or an antireflection layer may be formed between layer 40 and layer 44. There is a potential for internal reflections between layer 40 and layer 44 due to refractive index mismatch between layer 40 and layer 44, so incorporating a polarizer-based reflection suppression layer and/or an antireflection layer between layers 40 and 44 can help suppress reflected light. Illustrative locations 81 and 82 for forming antireflection layer 54 and/or reflection suppression layer 70 are shown in display 14 of FIG. 10. Location (layer) 81 may contain antireflection layer 54 and/or reflection suppression layer 70, location (layer) 82 may contain antireflection layer 54 and/or reflection suppression layer 70, and/or locations 81 and 82 may contain layers such as antireflection layer 54 and/or reflection suppression layer 70.

Wave plates, antireflection layers, linear polarizers, and other structures may be formed by laminating flexible films to display 14 (e.g., using pressure sensitive adhesive, optically clear liquid adhesive, etc.). For example, linear polarizer 72 may be attached to surface 48 of layer 44 using adhesive, an antireflection layer, anti-scratch layer, and/or other layers may be attached to quarter wave plate 74 using adhesive, etc. If desired, some or all of the adhesive layers in display 14 can be omitted. For example, one or more adhesive layers may be omitted when optical films such as a wave plate or other layers are deposited as coatings other layers in display 14 using thin-film deposition techniques.

The foregoing is merely illustrative and various modifications can be made to the described embodiments. The foregoing embodiments may be implemented individually or in any combination.

What is claimed is:

1. An electronic device, comprising:
   pixels configured to form a display;
   a support structure configured to support the display;
   an encapsulation layer on the pixels;
   a first quarter wave plate;
   a first linear polarizer between the first quarter wave plate and the pixels;
   a second quarter wave plate; and
   a second linear polarizer between the first linear polarizer and the encapsulation layer.
2. The electronic device of claim 1 wherein the pixels have a pixel density of at least 1000 pixels per inch.
3. The electronic device of claim 1 wherein the pixels have a pixel density of at least 1500 pixels per inch.
4. The electronic device of claim 1 further comprising a cover layer between the first linear polarizer and the pixels.
5. The electronic device of claim 1 further comprising:
   a lens overlapping the pixels, wherein the pixels are viewable through the lens.
6. The electronic device of claim 5 wherein the pixels have a pixel density of at least 1000 pixels per inch.
7. The electronic device of claim 1 further comprising a layer of adhesive between a cover layer and the encapsulation layer.
8. The electronic device of claim 1 further comprising:
   a lens, wherein the support structure comprises a head-mounted support structure configured to support the display for viewing through the lens.
9. An electronic device, comprising:
   a display that has pixels configured to display light, wherein the pixels include a light-emitting device, wherein the display has a quarter wave plate and has a linear polarizer, and wherein the linear polarizer is between the quarter wave plate and the pixels; and
   a lens configured to receive the light from the display.
10. The electronic device of claim 9 wherein the pixels have a pixel density of at least 1500 pixels per inch.
11. The electronic device of claim 9 wherein the light-emitting device in each pixel is an organic light-emitting diode.
12. The electronic device of claim 11 wherein the pixels are covered with a thin-film encapsulation layer.
13. The electronic device of claim 12 further comprising a glass layer, wherein the glass layer is between the linear polarizer and the thin-film encapsulation layer.
14. The electronic device of claim 13 wherein the linear polarizer is attached to an outwardly facing surface of the glass layer.
15. The electronic device of claim 9 wherein the lens is configured to transmit the light from the display towards an eye box.
16. An electronic device, comprising:
    a display, wherein the display comprises:
      pixels;
      a quarter wave plate overlapping the pixels;
      a linear polarizer overlapping the pixels;
      an encapsulation layer; and
      a glass cover layer between the linear polarizer and the encapsulation layer.
17. The electronic device of claim 16 wherein the pixels comprise organic light-emitting diode pixels.
18. The electronic device of claim 17 further comprising an anti-scratch layer on the quarter wave plate.
19. The electronic device of claim 18 further comprising an adhesive layer, wherein the adhesive layer is between the glass cover layer and the encapsulation layer.
20. The electronic device of claim 18, wherein the pixels are configured to display an image, the electronic device further comprises a lens, and the image is viewable through the lens.

* * * * *